United States Patent [19]

Kressel et al.

[11] 4,328,508

[45] May 4, 1982

[54] III-V QUATERNARY ALLOY PHOTODIODE

[75] Inventors: Henry Kressel, Elizabeth; Gregory H. Olsen, Plainsboro, both of N.J.

[73] Assignee: RCA Corporation, New York, N.Y.

[21] Appl. No.: 26,369

[22] Filed: Apr. 2, 1979

[51] Int. Cl.³ .......................................... H01L 29/161
[52] U.S. Cl. ...................... 357/16; 357/20; 357/58; 357/61; 357/30
[58] Field of Search .............. 357/61, 58, 20, 30, 357/17, 16

[56] References Cited

U.S. PATENT DOCUMENTS

| | | | |
|---|---|---|---|
| 3,586,925 | 6/1971 | Collard | 307/234 |
| 3,821,777 | 6/1974 | James | 357/30 |
| 3,860,945 | 1/1975 | Dawson | 357/20 X |
| 3,928,866 | 12/1975 | Digoy | 357/30 |
| 3,982,261 | 9/1976 | Antypas | 357/16 |
| 4,116,733 | 9/1978 | Olsen | 148/175 |
| 4,195,305 | 3/1980 | Moon | 357/61 X |
| 4,237,471 | 12/1980 | Pommerring | 357/30 |
| 4,258,375 | 3/1981 | Hisieh | 357/30 XR |

FOREIGN PATENT DOCUMENTS 1261789 1/1972 United Kingdom .
1419695 12/1975 United Kingdom .

OTHER PUBLICATIONS

Hsieh et al., *Appl. Phys. Lett.,* Apr. 15, 1978, vol. 32 (8).

Wieder et al., *Appl. Phys. Lett.,* vol. 31, No. 7, Oct. 1, 1977.

Moon et al., *Journ. of Electronic Materials,* vol. 3, No. 3, 1974.

Tomasetta, *IEEE Journ. of Quantum Electronics,* vol. QE14, No. 11, Nov. 1978.

*Primary Examiner*—Martin H. Edlow
*Attorney, Agent, or Firm*—Birgit E. Morris; William J. Burke

[57] ABSTRACT

A III-V quaternary alloy photodiode comprises an n-type III-V binary alloy body; a III-V quaternary alloy layer chosen to have about the same lattice constant as that of said body grown on a major surface of said body; an electrically insulating layer grown on said quaternary alloy layer and having an opening therein extending through said second layer; a p-type layer of the same III-V binary alloy as said body, grown on said quaternary alloy layer in the area contiguous with the opening in said electrically insulating layer; a p-type region in said quaternary alloy layer in the region contiguous with the opening in said electrically insulating layer; and electrically conducting layers overlying a portion of said p-type binary alloy layer and of a second major surface of said body to provide electrical contact to the photodiode. The III-V quaternary alloy layer may be of n-type conductivity, electrically insulating, or have n-type and electrically insulating regions.

13 Claims, 3 Drawing Figures ature of the light source. Silicon p-i-n and avalanche photodiodes are highly sensitive radiation detectors at this wavelength and out to about 1060 nanometers, beyond which their sensitivity decreases markedly due to the very low absorption coefficient of the silicon material. Optical communication systems which operate in the range of 1100 to 1500 nanometers are of potentially great importance because the wavelength dispersion of the optical fiber is much less in this range, thus permitting higher bandwidth signals to be transmitted through the optical fiber. Lasers and detectors for use in this wavelength range are currently under development.

III-V QUATERNARY ALLOY PHOTODIODE

The Government has rights to this invention under Contract No. DAAB07-76-C-0872.

An optical communication system comprises a light source, an optical fiber along which the light signal is transmitted, and a light detector of the transmitted light. Typical light sources include an aluminum gallium arsenide light emitting diode or injection laser which operates at about 820 nanometers. Silicon p-i-n and avalanche photodiodes are highly sensitive radiation detectors at this wavelength and out to about 1060 nanometers, beyond which their sensitivity decreases markedly due to the very low absorption coefficient of the silicon material. Optical communication systems which operate in the range of 1100 to 1500 nanometers are of potentially great importance because the wavelength dispersion of the optical fiber is much less in this range, thus permitting higher bandwidth signals to be transmitted through the optical fiber. Lasers and detectors for use in this wavelength range are currently under development.

III-V quaternary alloys on III-V binary alloy substrates where the group III elements are gallium, hereinafter Ga, and indium, hereinafter In, and the group V elements are phosphorous, hereinafter P, arsenic, hereinafter As, and antimony, hereinafter Sb, and in particular indium gallium arsenide phosphide quaternary alloys, hereinafter $In_xGa_{1-x}As_yP_{1-y}$, where x and y are the fractional concentrations of indium and arsenic respectively, on indium phosphide, hereinafter InP, substrates, are being investigated both as laser sources and detectors in the 1100–1500 mm wavelength ranges. A quaternary alloy as used herein is understood to include the alloys at the end points of the concentration ranges, e.g., where the concentration of one of the elements is zero (a ternary or binary alloy).

III-V quaternary alloys are of interest for this application since the onset of the fundamental optical absorption, hereinafter the bandgap, and the lattice constant of the alloy can be varied independently from one another by varying the relative concentrations of the constituent elements. Thus, an exact lattice constant match to the III-V binary alloy substrate can be obtained while still varying the wavelength of response of the sensitive layer. A lattice constant match between the sensitive layer and the substrate layer is desirable to reduce the number of defects, including dislocations and strain in the sensitive layer resulting from a lattice mismatch, which degrade the device performance. Lattice mismatch may be tolerated enen though it degrades device performance since it would permit other III-V compounds to be used or would relax the tolerances on the layer growth processes. Moon et al., *Journal of Electronic Materials*, Vol. 3, p. 635 (1974), have described extrapolated calculations of the bandgap and lattice constant of $In_xGa_{1-x}As_yP_{1-y}$ as a function of the relative concentrations of the constituent elements. From their data it can be determined that for a lattice matched device with a bandgap of about 1120 nanometers, the concentrations of the elements are $In_{0.85}Ga_{0.15}As_{0.32}P_{0.68}$ and for a bandgap of 1300 nanometers the concentrations are $In_{0.74}Ga_{0.26}As_{0.56}P_{0.44}$. By varying the relative concentration of the constituent elements in this manner the bandgaps of the layer can be varied from about the 920 nanometer bandgap of InP to about 1700 nanometers while maintaining the lattice constant identical to that of the InP substrate layer.

Hurwitz et al., *Applied Physics Letters*, Vol. 32, p. 487 (1978), have described a mesa type avalanche photodiode which comprises a p-type InP substrate upon which an n-type layer of $In_xGa_{1-x}As_yP_{1-y}$ and a layer of n-type InP were sequentially grown by liquid phase epitaxy. A p-n homojunction was formed in the $In_xGa_{1-x}As_yP_{1-y}$ layer by diffusion of zinc from the substrate after growth. Mesa type avalanche photodiodes were then formed from this layered structure by suitable photolithographic and etching techniques. Electrical contact was then made to the p- and n-type InP layers. The InP p- and n-type layers are both transparent for wavelengths greater than about 920 nanometers and serve as windows by which light of wavelength longer than 920 nanometers is transmitted to the sensitive $In_xGa_{1-x}As_yP_{1-y}$ layer. These devices have a typical avalanche gain or electrical signal current multiplication of about 8 and which can vary up to a maximum of about 12.5.

Tomasetta et al., *IEEE Journal of Quantum Electronics*, Vol. QE14, p. 800 (1978), have described a mesa type heterojunction avalanche photodiode which comprises an n-type gallium antimonide, hereinafter GaSb, substrate, a n-type gallium aluminum antimonide, hereinafter GaAlSb, layer, and a p-type aluminum gallium arsenide antimonide, hereinafter $Al_yGa_{1-y}As_zSb_{1-z}$ layer with the GaAlSb and $Al_yGa_{1-y}As_zSb_{1-z}$ layers forming a p-n heterojunction.

The performance of these devices is sensitive to electrical breakdown and surface leakage currents at the exposed joint. Mesa geometrics also require additional processing steps to form the mesa structure. It would be desirable to have a planar photodiode, sensitive in this wavelength range, in which the sensitivity to surface effects at the junction region as well as the additional processing steps required to form a mesa structure are eliminated.

SUMMARY OF THE INVENTION

The invention is a photodiode which comprises a body of an n-type III-V binary alloy having two opposed major surfaces, a first layer of a III-V quaternary alloy, chosen to have about the same lattice constant as the body overlying a first major surface of said body, a second layer of electrically insulating material with an opening therein overlying said first layer, a region of p-type conductivity in the portion of the first layer contiguous with the opening in the second layer, a third layer of a p-type III-V binary alloy overlying said first layer in the region defined by the opening in said second layer, and electrically conducting layers overlying a portion of said third layer and a portion of a second major surface of said body so as to form an electrical contact to said photodiode.

DETAILED DESCRIPTION OF THE INVENTION

Figure 1:
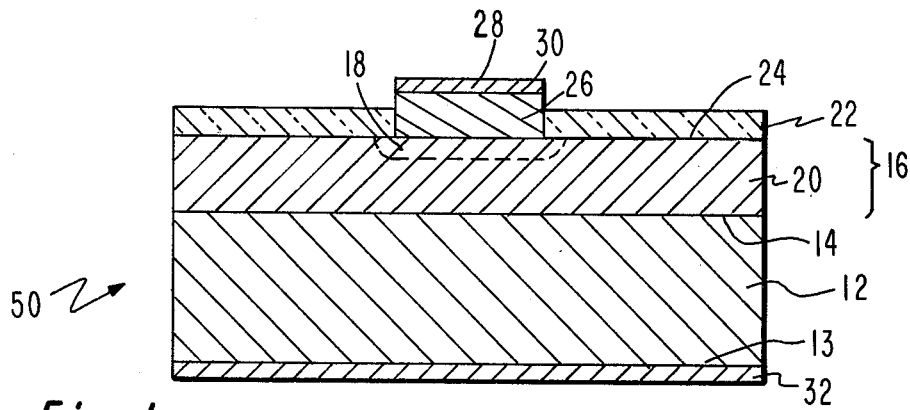
FIGS. 1, 2 and 3 are schematic illustrations of different embodiments of the photodiode of the invention.

FIG. 1 shows a schematic illustration of a first embodiment 50 of the photodiode. A body 12, having two major opposed surfaces 13 and 14 is made of an n-type III-V binary alloy. A first layer 16 of a III-V quaternary alloy overlies a first major surface 14 of the body 12.

The layer 16 is comprised of a p-type region 18 and a second region 20. The second region 20 may be of n-type conductivity in which case a p-n homojunction is formed by the p-type region 18 and the n-type region 20. Alternatively, the second region 20 may be electrically insulating in which case a p-i-n heterojunction is formed by the p-type region 18, the insulating region 20 and the n-type body 12. A second layer 22 of an electrically insulating material, having an opening therein extending completely through the layer, overlies a surface 24 of the first layer 16. The p-type region 18 is contiguous with the opening in the second layer 22. A p-type layer 26 of the same III-V binary alloy as forms the body 12 overlies the surface 24 of the first layer 16 in the region of the opening. An electrical conducting layer 28 overlies a portion of the surface 30 of the binary alloy layer 26, and a second electrically conducting layer 32 overlies a portion of the second major surface 13 of the body 12 to provide electrical contact to the photodiode 50.

Figure 2:
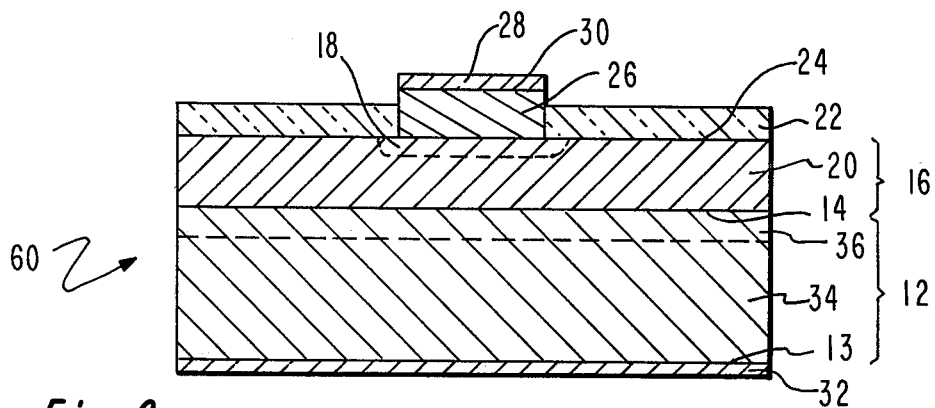

FIG. 2 shows a second embodiment 60 of the photodiode where the body 12 is comprised of a n-type III-V binary alloy substrate 34 and an epitaxial layer 36 overlying the substrate 34. The epitaxial layer 36 is formed of the same III-V binary alloy as the substrate and has about the same electrical conductivity. The utility of the epitaxial layer 36 is in that it provides a fresh surface for the growth of the first layer 16.

Figure 3:
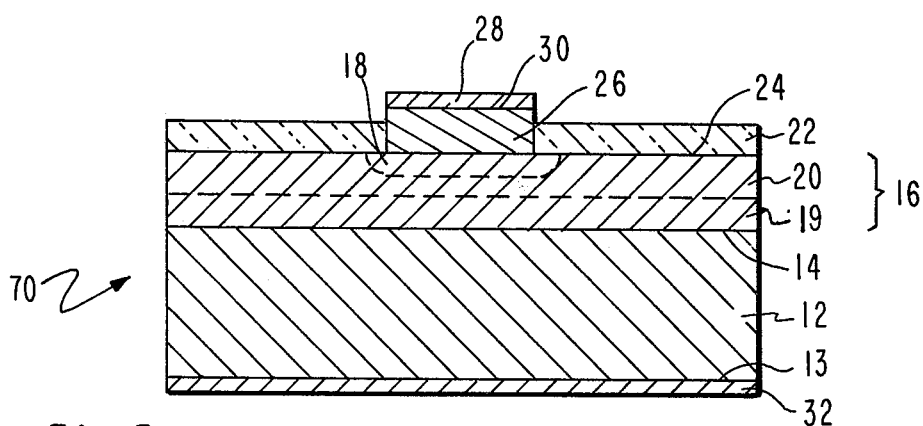

FIG. 3 shows a third embodiment 70 of the photodiode where the quaternary alloy layer 16 is comprised of a n-type conductivity region 19 overlying the body 12, an electrically insulating region 20 overlying the n-type conductivity region 19 and a p-type conductivity region 18 contiguous with the opening in the second layer 22. In this case the p-type region 18, the electrically insulating region 20 and the n-type region 19 form a p-i-n homojunction in the first layer 16.

The p-type III-V binary alloy and the relative concentration of the constituent elements of the III-V quaternary alloy are chosen such that these layers will have about the same lattice constant as the III-V binary alloy body. III-V quaternary alloys used to form the photodiode of the invention and the corresponding III-V binary alloys to which they can be lattice matched are: $In_x Ga_{1-x} As_y P_{1-y}$ with InP; $In_r Ga_{1-r} As_s P_{1-s}$ with gallium arsenide where r is between 0 and about 0.5, hereinafter GaAs; and $Al_v Ga_{1-v} As_z Sb_{1-z}$ with GaSb where v is between 0 and 1 and z is between 0 and about 0.1.

The layers of the structure may be grown using molecular beam, liquid or vapor phase epitaxial techniques. The InP and $In_x Ga_{1-x} As_y P_{1-y}$ layers were grown by the vapor phase technique using a reactor similar to that disclosed by Olsen et al., in U.S. Pat. No. 4,116,733, incorporated herein by reference.

The characteristics of the layers of the photodiode can be shown from a structure formed from a particular pair of materials, for example $In_x Ga_{1-x} As_y P_{1-y}$ with InP. An n-type InP substrate 34 may be used for the fabrication of the device. The substrate resistivity is typically less than 0.01 ohm/cm. The substrate can have any crystallographic orientation but a {100} orientation or an orientation up to about 5 degrees off to a {100} direction is preferred. This latter orientation provides improved surface morphology for the layers subsequently grown on the surface. The thickness of the substrate is arbitrary, provided it is of sufficient thickness to support the remainder of the structure. Typically, suitable thicknesses range from about 75 microns to about 400 microns.

The epitaxial layer 36 is formed of the same III-V binary alloy as the substrate 34. The n-type dopant concentration in this layer 36 is such that its electrical resistivity is about the same as that of the substrate 34. The thickness of this layer 36 is typically about 5 microns.

The first layer 16 is formed of $In_x Ga_{1-x} As_y P_{1-y}$ which will provide both the photon absorbing region for wavelengths between 920 and 1700 nanometers, depending upon the concentrations of the constituent elements, and the detecting region in that the p-n or p-i-n junction is formed in this layer. The relative concentrations of the four constituent elements of this layer are chosen so as to provide a lattice match to the lattice constant of the body 12 and to provide a bandgap for the material at a wavelength slightly longer than that of the light beam to be detected. Typically, the bandgap is set at approximately 20 nanometers greater that that of the incident light beam. Because there is a rapid increase in optical absorption at the bandgap of $In_x Ga_{1-x} As_y P_{1-y}$ the sensitivity is not increased by extending the wavelength response to longer wavelengths but only results in an increased thermal dark current which will be detrimental to the signal to noise ratio obtainable for light of a given wavelength. In the $Al_y Ga_{1-v} As_z Sb_{1-z}$ quaternary alloy there is only a slowly increasing optical absorption at the bandgap over a certain range of alloy compositions and therefore such compositions are less desirable since a much thicker layer of the quaternary alloy is required to provide sufficient optical absorption.

The $In_x Ga_{1-x} As_y P_{1-y}$ region 20 or regions 19 and 20 can vary in thickness typically from about 1 to about 5 microns. If regions 19 or 20 are of n-type conductivity the n-type dopant concentration is typically about $2 \times 10^{16}/cm^3$ or less, with silicon the usual n-type dopant. If the region 20 is electrically insulating the dopant concentration is less than $10^{15}/cm^3$. If the layer is to be electrically insulating special precautions must be taken to eliminate trace contaminants from the reactor or additional elements such as Cr and Fe must be added to provide electrical compensation.

The electrically insulating second layer 22 is formed of a material such as $SiO_2$, $Al_2O_3$ or $Si_3N_4$. The $SiO_2$ or $Al_2O_3$ layer can be formed by evaporation techniques. A $SiO_2$ layer can alternatively be formed by cracking silane at 400° C. in an oxygen atmosphere. A $Si_3N_4$ layer can be formed by sputtering or plasma deposition techniques. The thickness of the insulating layer is not critical as long as a continuous electrically insulating coating is formed over the $In_x Ga_{1-x} As_y P_{1-y}$ layer. A typical thickness of this layer is about 100 to about 200 nanometers.

The opening in the second layer 22 is formed using standard photolithographic techniques with photoresist to define the diameter of the opening and then etching through the second layer in the area so defined down to the surface 24 of the first layer 16.

A p-type InP layer 26 is grown on the first layer 16 in the region of the opening in the insulating layer 22. The p-type dopant is typically zinc with a concentration of $1-5 \times 10^{18}/cc$. The layer is grown to a thickness of about 1 micron. During or after the growth of the layer 26, the zinc dopant diffuses into the first layer 16 forming a p-type region 18 in the region contiguous with the opening in the opening in the second layer 22 and with the p-type InP layer 26. Typically, the zinc diffuses about 100 to 200 nanometers into the first layer 16. Alternatively the p-type region 18 could be formed prior to the growth of the p-type InP layer 26 by diffusion or ion implantation techniques.

In the photodiode according to the invention the junction is isolated from the sides of the structure and its cross-sectional area is controlled by the size of the opening in the electrically insulating layer. This device structure minimizes problems with sidewall surface leakage and the extensive etching processing required to fabricate a mesa structure while the maximum avalanche gain or electrical signal current multiplication is equal to or greater than that obtained from prior art devices.

EXAMPLE

A photodiode was constructed using InP and $In_xGa_{1-x}As_yP_{1-y}$.

An n-type InP substrate was prepared by etching in a solution of 1% bromine in methanol for about 10 minutes. An n-type InP epitaxial layer about 5 microns thick was grown on the substrate by simultaneously flowing over an n-type InP substrate, held at about 700° C., the following gases, each heated to about 850° C.: InCl formed by passing HCl gas at about 41 ccm over a container of In heated to about 850° C.; PH$_3$ gas at about 11 ccm, and H$_2$S gas diluted to about 100 ppm in H at about 70 ccm. The H$_2$S gas supplies the n-type dopant, sulphur.

A layer of about 2 microns thick of $In_{0.73}Ga_{0.27}As_{0.59}P_{0.41}$ which has a bandgap of about 1320 nanometers was grown on the InP body by simultaneously flowing over an n-type substrate, with or without the InP epitaxial layer held at about 700° C., the following gases, each heated to about 850° C.: InCl formed by passing HCl gas at about 41 ccm over a container of In heated to about 850° C.; GaCl formed by passing HCl gas at about 1.2 ccm over a container of Ga heated to about 850° C., PH$_3$ gas at about 11 ccm; and AsH$_3$ gas at about 4 ccm. The n-type dopant, Si, arises from trace contaminants in the reactor.

A 200 nanometer thick SiO$_2$ layer was grown on the $In_{0.73}Ga_{0.27}As_{0.59}P_{0.41}$ layer by cracking silane in a one atmosphere oxygen ambient at about 400° C. A 100 micron diameter hole opening was formed in the SiO$_2$ layer using standard photolithographic and etching techniques. Buffered HF was used to etch the SiO$_2$ layer.

The surface of the $In_{0.73}Ga_{0.27}As_{0.59}P_{0.41}$ layer in the region of the opening in the SiO$_2$ layer was etched using a solution of 0.1 percent bromine in methanol for about two minutes. A p-type InP layer with zinc as the p-type dopant was grown in the region of the opening in the SiO$_2$ layer on the surface of the $In_{0.73}Ga_{0.27}As_{0.59}P_{0.41}$ layer by simultaneously flowing over the structure, held at about 700° C., the following gases, each heated to about 850° C.: InCl formed by passing HCl gas at about 41 ccm over a container of In heated to about 850° C.; PH$_3$ gas at about 11 ccm; and H$_2$ at about 1000 ccm after flowing over a container of Zn heated to about 400° C. The thickness of this layer was about 1 micron and is restricted to the region of the opening since it will not grow on the surface of the SiO$_2$ layer.

An electrical contact of a gold zinc alloy was then evaporated onto the p-type InP layer. The substrate was then lapped from the n-type surface to about 100 microns thickness. The electrode on the n-type InP substrate was formed by the sequential evaporation of tin and gold. The extent of the coverage of each of these electrode layers, and their optical transparency, will depend upon which direction that it is desired that light be incident on the sensitive $In_xGa_{1-x}As_yP_{1-y}$ layer.

This device was tested by measuring its electrical output characteristics with and without applied reverse bias. Light was incident at the wavelength of interest, in this case 1300 nanometers, on a sample placed at the exit port of a monochromator. The electrical signal current was measured without an applied bias. A dc reverse bias ranging from 30 to 60 volts was then applied to the device and the electrical signal current produced by the device was measured.

An avalanche gain or electrical current multiplication at constant light input equal to the ratio of the signal current with applied bias to that without bias ranging from about 4 to about 20 at 60 volts was measured in the devices tested.

We claim:
1. A photodiode which comprises:
    a body of an n-type III-V binary alloy having two opposed major surfaces;
    a first layer of a III-V quaternary alloy overlying a first major surface of said body wherein the lattice constant of said alloy is about the same as the lattice constant of said body;
    a second layer of an electrically insulating material, with an opening extending through said second layer, overlying said first layer;
    a third layer of the same III-V binary alloy as said first layer having a p-type dopant, overlying said first layer in the region defined by the opening in said second layer;
    a region of p-type conductivity in a portion of said first layer contiguous with the opening in said second layer;
    an electrically conducting layer overlying a portion of said third layer so as to form an electrical contact to said third layer;
    an electrically conducting layer overlying a portion of a second major surface of said body so as to form an electrical contact to said second major surface.
2. A photodiode according to claim 1 wherein said first layer is electrically insulating whereby a p-i-n heterojunction is formed by said p-type region, said electrically insulating first layer and said n-type body.
3. A photodiode according to claim 1 wherein said first layer is of n-type conductivity whereby a p-n homojunction is formed between said p-type region and said n-type first layer.
4. A photodiode according to claim 1 wherein said first layer is comprised of a region of n-type conductivity contiguous with and overlying said body and an electrically insulating region contiguous with and overlying said n-type conductivity region whereby a p-i-n homojunction is formed in said first layer by said p-type region, said electrically insulating region and said n-type region.
5. A photodiode according to claim 1 wherein said body is comprised of n-type InP, said first layer is comprised of $In_xGa_{1-x}As_yP_{1-y}$, and said third layer is comprised of p-type InP.
6. A photodiode according to claim 5 wherein x varies from about 0.55 to about 1.00, and y varies from about 0.0 to about 1.0.
7. A photodiode according to claim 5 wherein x varies from about 0.70 to about 0.80, and y varies from about 0.50 to about 0.70.

8. A photodiode according to claim 1 wherein body is comprised of n-type GaAs, said first layer is comprised of $In_rGa_{1-r}As_sP_{1-s}$ and said third layer is comprised of p-type GaAs.

9. A photodiode according to claim 8 wherein r varies from about 0 to about 0.5, and s varies from about 0 to about 1.0.

10. A photodiode according to claim 1 wherein said body is comprised of n-type GaSb, said first layer is comprised of $Al_vGa_{1-v}As_zSb_{1-z}$ and said third layer is comprised of p-type GaSb.

11. A photodiode according to claim 10 wherein v varies from about 0 to about 1.0, and z varies from about 0 to about 0.1.

12. A photodiode according to claim 1 wherein the insulating material of said second layer is selected from the group consisting of silicon dioxide, aluminum oxide, and silicon nitride.

13. A photodiode according to claim 1 wherein the p-type dopant of said third layer and said p-type region is zinc.

* * * * *